(12) United States Patent
Hosoe

(10) Patent No.: US 8,976,617 B2
(45) Date of Patent: Mar. 10, 2015

(54) SEMICONDUCTOR DEVICE HAVING PLURAL SELECTION LINES SELECTED BASED ON ADDRESS SIGNAL

(71) Applicant: Elpida Memory, Inc., Tokyo (JP)

(72) Inventor: Yuki Hosoe, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 126 days.

(21) Appl. No.: 13/670,380

(22) Filed: Nov. 6, 2012

(65) Prior Publication Data

US 2013/0114366 A1     May 9, 2013

(30) Foreign Application Priority Data

Nov. 9, 2011   (JP) ................................ 2011-245029

(51) Int. Cl.
*G11C 8/10*       (2006.01)
*G11C 11/4076*    (2006.01)
*G11C 5/02*       (2006.01)
*G11C 11/408*     (2006.01)
*G11C 11/4093*    (2006.01)

(52) U.S. Cl.
CPC .............. *G11C 11/4076* (2013.01); *G11C 5/02* (2013.01); *G11C 11/4087* (2013.01); *G11C 11/4093* (2013.01)
USPC .................................................... 365/230.06

(58) Field of Classification Search
USPC ......... 365/189.07, 230.06; 33/189.07, 230.06
See application file for complete search history.

(56) References Cited

U.S. PATENT DOCUMENTS

| 6,560,159 | B2  | 5/2003  | Mochida |
| 6,603,688 | B2* | 8/2003  | Hasegawa et al. ............ 365/200 |
| 6,807,121 | B2  | 10/2004 | Natsui et al. |
| 2003/0112689 | A1 | 6/2003 | Natsui et al. |

FOREIGN PATENT DOCUMENTS

JP      2003-187578 A      7/2003

* cited by examiner

*Primary Examiner* — Hoai V Ho
(74) *Attorney, Agent, or Firm* — McGinn IP Law Group, PLLC

(57) ABSTRACT

Disclosed herein is a device that includes: a set of address terminals supplied with a set of address signals, each of the address signals being changed in logic level; memory mats to which address ranges are allocated, respectively, the address ranges being different from each other, each of the memory mats including memory cells; and decoder units each provided correspondingly to corresponding memory mat. Each of the decoder units includes a set of first input nodes and a set of second input nodes, the set of first input nodes of each of the decoder units being coupled to the set of address terminals to receive the set of address signals, the set of second input nodes of each of the decoder units being coupled to receive an associated one of sets of control signals, each of the control signals being fixed in logic level.

5 Claims, 16 Drawing Sheets

| | | | | | | | | | | | | | | | | |
|---|---|---|---|---|---|---|---|---|---|---|---|---|---|---|---|---|
| X7 | 0 | 1 | 0 | 1 | 1 | 0 | 1 | 1 | 0 | 1 | 1 | 0 | 1 | 0 | 1 | 1 |
| X8 | 0 | 0 | 1 | 1 | 0 | 0 | 1 | 1 | 0 | 0 | 1 | 1 | 0 | 0 | 1 | 1 |
| X9 | 0 | | | | 1 | | | | 0 | | | | 1 | | | |
| X10 | 0 | | | | | | | | 1 | | | | | | | |
| 11→ | MAT0 | MAT1 | MAT2 | MAT3 | MAT4 | MAT5 | MAT6 | MAT7 | MAT8 | MAT9 | MAT10 | MAT11 | MAT12 | MAT13 | MAT14 | MAT15 |

FIG.4

| X7 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
|---|---|---|---|---|---|---|---|---|---|---|---|---|---|---|---|---|---|---|---|---|---|---|---|---|
| X8 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 |
| X9 | 0 | | | 0 | | | 1 | | | 0 | | | 1 | | | 0 | | | 1 | | | 0 | | 1 |
| X10 | 0 | | | | | | | | | | | 1 | | | | | | | | | | | | |
| 11 → | MAT0 | MAT1 | MAT2 | MAT3 | MAT4 | MAT5 | MAT6 | MAT7 | MAT8 | MAT9 | MAT10 | MAT11 |

FIG.6

| IN⟨2:0⟩ | | | OUT⟨7:0⟩ | | | | | | | |
|---|---|---|---|---|---|---|---|---|---|---|
| ⟨2⟩ | ⟨1⟩ | ⟨0⟩ | ⟨7⟩ | ⟨6⟩ | ⟨5⟩ | ⟨4⟩ | ⟨3⟩ | ⟨2⟩ | ⟨1⟩ | ⟨0⟩ |
| 0 | 0 | 0 | 0 | 0 | 0 | 0 | 0 | 0 | 0 | 1 |
| 0 | 0 | 1 | 0 | 0 | 0 | 0 | 0 | 0 | 1 | 0 |
| 0 | 1 | 0 | 0 | 0 | 0 | 0 | 0 | 1 | 0 | 0 |
| 0 | 1 | 1 | 0 | 0 | 0 | 0 | 1 | 0 | 0 | 0 |
| 1 | 0 | 0 | 0 | 0 | 0 | 1 | 0 | 0 | 0 | 0 |
| 1 | 0 | 1 | 0 | 0 | 1 | 0 | 0 | 0 | 0 | 0 |
| 1 | 1 | 0 | 0 | 1 | 0 | 0 | 0 | 0 | 0 | 0 |
| 1 | 1 | 1 | 1 | 0 | 0 | 0 | 0 | 0 | 0 | 0 |

FIG.10

| IN⟨2:0⟩ | | | OUT⟨7:0⟩ | | | | | | | |
|---|---|---|---|---|---|---|---|---|---|---|
| ⟨2⟩ | ⟨1⟩ | ⟨0⟩ | ⟨7⟩ | ⟨6⟩ | ⟨5⟩ | ⟨4⟩ | ⟨3⟩ | ⟨2⟩ | ⟨1⟩ | ⟨0⟩ |
| 0 | 0 | 0 | 0 | 0 | 0 | 0 | 0 | 0 | 0 | 1 |
| 0 | 0 | 1 | 0 | 0 | 0 | 0 | 0 | 0 | 1 | 1 |
| 0 | 1 | 0 | 0 | 0 | 0 | 0 | 0 | 1 | 1 | 1 |
| 0 | 1 | 1 | 0 | 0 | 0 | 0 | 1 | 1 | 1 | 1 |
| 1 | 0 | 0 | 0 | 0 | 0 | 1 | 1 | 1 | 1 | 1 |
| 1 | 0 | 1 | 0 | 0 | 1 | 1 | 1 | 1 | 1 | 1 |
| 1 | 1 | 0 | 0 | 1 | 1 | 1 | 1 | 1 | 1 | 1 |
| 1 | 1 | 1 | 1 | 1 | 1 | 1 | 1 | 1 | 1 | 1 |

FIG.11

| IN⟨2:0⟩ | | | OUT⟨7:0⟩ | | | | | | | |
|---|---|---|---|---|---|---|---|---|---|---|
| ⟨2⟩ | ⟨1⟩ | ⟨0⟩ | ⟨7⟩ | ⟨6⟩ | ⟨5⟩ | ⟨4⟩ | ⟨3⟩ | ⟨2⟩ | ⟨1⟩ | ⟨0⟩ |
| 0 | 0 | 0 | 0 | 0 | 0 | 0 | 0 | 0 | 0 | 0 |
| 0 | 0 | 1 | 0 | 0 | 0 | 0 | 0 | 0 | 0 | 1 |
| 0 | 1 | 0 | 0 | 0 | 0 | 0 | 0 | 0 | 1 | 1 |
| 0 | 1 | 1 | 0 | 0 | 0 | 0 | 0 | 1 | 1 | 1 |
| 1 | 0 | 0 | 0 | 0 | 0 | 0 | 1 | 1 | 1 | 1 |
| 1 | 0 | 1 | 0 | 0 | 0 | 1 | 1 | 1 | 1 | 1 |
| 1 | 1 | 0 | 0 | 0 | 1 | 1 | 1 | 1 | 1 | 1 |
| 1 | 1 | 1 | 0 | 1 | 1 | 1 | 1 | 1 | 1 | 1 |

FIG.13

SEMICONDUCTOR DEVICE HAVING PLURAL SELECTION LINES SELECTED BASED ON ADDRESS SIGNAL

BACKGROUND OF THE INVENTION

1. Field of the Invention

The present invention relates to a semiconductor device, and more particularly to a semiconductor device that selects any one of a plurality of selection lines based on an address signal.

2. Description of Related Art

A semiconductor memory device, typified by a dynamic random access memory (DRAM), includes a large number of word lines for selecting memory cells. To select any one of the word lines, a row address constituted of a plurality of bits needs to be decoded.

With the recent growth in storage capacity, however, the number of bits of a row address has become more than ten. Decoding such a row address at a time not only needs an extremely large number of elements for the decoder but also lowers the decoding speed. Upper bits of the row address are therefore typically predecoded to select any one of memory mats, and lower bits of the row address are predecoded to select a word line included in the selected memory mat (see Japanese Patent Application Laid-Open No. 2003-187578). This can reduce the number of elements needed for the decoder and increase the decoding speed.

Depending on the configuration, however, the memory mats may not be able to be selected by predecoding only the upper bits of the row address, and there is a case where most of the bits constituting the row address may need to be predecoded. In such a case, there has been a problem that the number of elements needed for the predecoder becomes extremely large with a drop in the decoding speed.

Such a problem is not limited to circuits for selecting word lines and can also occur in circuits for selecting other selection lines such as column selection lines. The problem is not limited to semiconductor memory devices such as a DRAM, either, and can occur in semiconductor devices in general that include a plurality of selection lines.

SUMMARY

In one embodiment, there is provided a device that includes: a plurality of circuit blocks each including a plurality of selection lines to which respective different addresses are assigned so that respective different address ranges are assigned to the circuit blocks; a first selection circuit selecting one of the circuit blocks by comparing an address signal with information related to the address ranges of the circuit blocks; and a second selection circuit selecting at least one of the selection lines included in selected one of the circuit blocks based on the address signal.

In another embodiment, there is provided a device that includes: a set of address terminals supplied with a set of address signals, each of the address signals being changed in logic level; a plurality of memory mats to which a plurality of address ranges are allocated, respectively, the address ranges being different from each other, each of the memory mats including a plurality of memory cells; and a plurality of decoder units each provided correspondingly to an associated one of the memory mats, each of the decoder units including a set of first input nodes and a set of second input nodes, the set of first input nodes of each of the decoder units being coupled to the set of address terminals to receive the set of address signals, the set of second input nodes of each of the decoder units being coupled to receive an associated one of sets of control signals, each of the control signals being fixed in logic level.

BRIEF DESCRIPTION OF THE DRAWINGS

FIG. 4 is a schematic diagram showing an example where the memory cell array is divided into sixteen memory mats MAT0 to MAT15;

FIG. 6 is a schematic diagram showing an example where the memory cell array is divided into twelve memory mats MAT0 to MAT11;

FIG. 10 shows a truth table of the decoder 210 shown in FIG. 9;

FIG. 11 shows a truth table of the decoder 220 shown in FIG. 9;

FIG. 13 shows a truth table of the decoder 330 shown in FIG. 12;

DETAILED DESCRIPTION OF THE EMBODIMENTS

Figure 1:
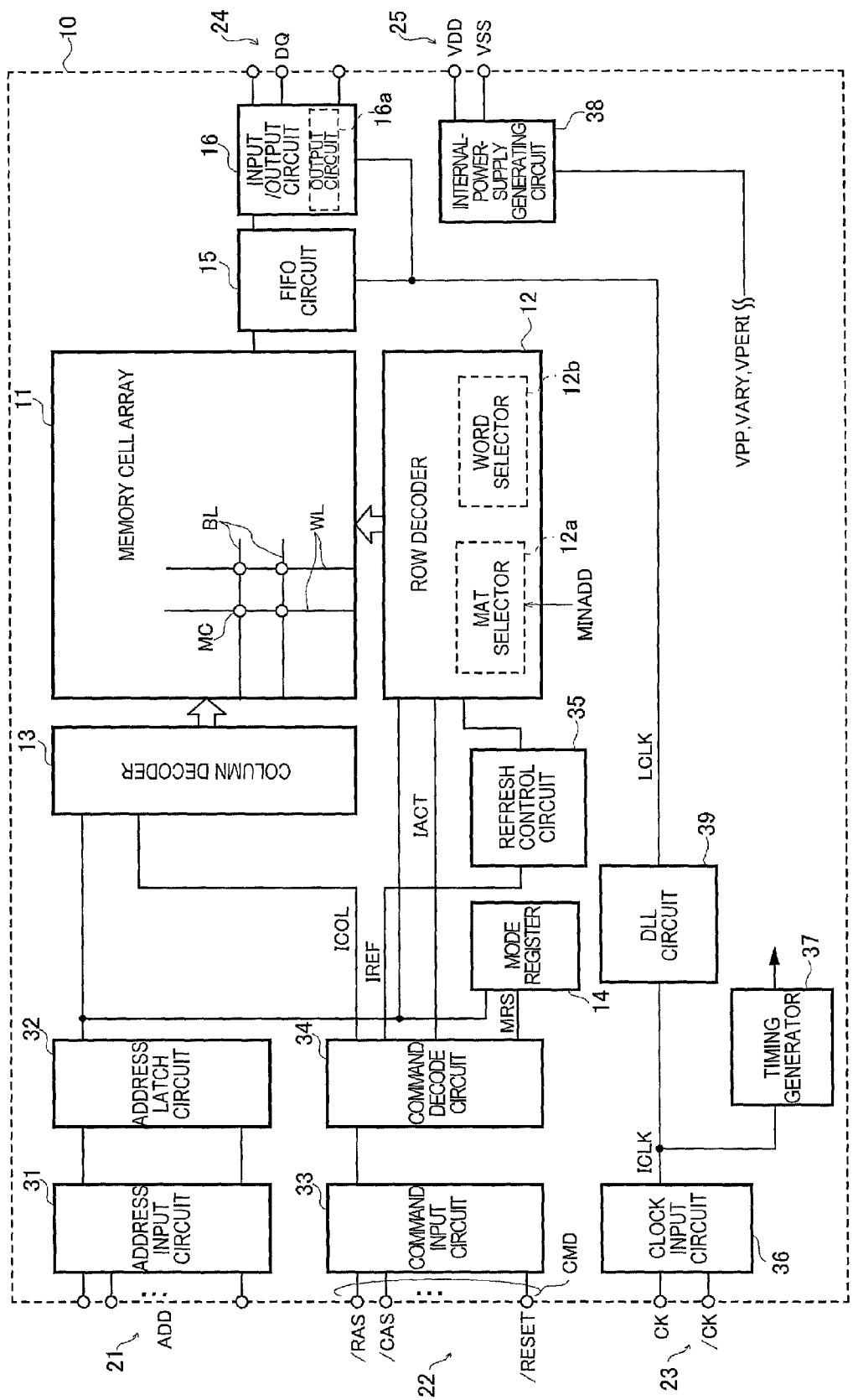
FIG. 1 is a block diagram indicative of an embodiment of an overall configuration of a semiconductor device according to an embodiment of the present invention.

Referring now to FIG. 1, the semiconductor device 10 according to the embodiment of the present invention is a DRAM including a memory cell array 11. The memory cell array 11 includes a plurality of word lines WL, a plurality of bit lines BL, and a plurality of memory cells MC arranged at their intersections. The selection of the word line WL is performed by a row decoder 12 and the selection of the bit line BL is performed by a column decoder 13. The memory cell array 11 is divided into a plurality of memory mats, which will be described later.

As shown in FIG. 1, the semiconductor device 10 is provided with a plurality of external terminals including address terminals 21, command terminals 22, clock terminals 23, data terminals 24, and power supply terminals 25.

The address terminals 21 are supplied with an address signal ADD from outside. The address signal ADD supplied to the address terminals 21 are transferred via an address input circuit 31 to an address latch circuit 32 that latches the address signal ADD. The address signal ADD latched in the address latch circuit 32 is supplied to the row decoder 12, the column decoder 13, or a mode register 14. The mode register 14 is a circuit in which parameters indicating an operation mode of the semiconductor device 10 are set.

The command terminals 22 are supplied with a command signal CMD from outside. The command signal CMD is constituted by a plurality of signals such as a row-address strobe signal /RAS, a column-address strobe signal /CAS, a reset signal /RESET and so on. The slash "/" attached to the head of a signal name indicates an inverted signal of a corresponding signal or indicates a low-active signal. The command signal CMD supplied to the command terminal 22 is transferred via a command input circuit 33 to a command decode circuit 34. The command decode circuit 34 decodes the command signal CMD to generate various internal commands including an active signal IACT, a column signal ICOL, a refresh signal IREF, and a mode register set signal MRS.

The active signal TACT is activated when the command signal CMD indicates a row access (an active command). When the active signal TACT is activated, the address signal ADD latched in the address latch circuit 32 is supplied to the row decoder 12. The word line WL designated by this address signal ADD is selected accordingly. The row decoder 12 includes a mat selector 12a and a word selector 12b, which will be described later. In this specification, the mat selector 12a may be referred to as a "first selection circuit." The word selector 12b may be referred to as a "second selection circuit."

The column signal ICOL is activated when the command signal CMD indicates a column access (a read command or a write command). When the column signal ICOL is activated, the address signal ADD latched in the address latch circuit 32 is supplied to the column decoder 13. In this manner, the bit line BL designated by this address signal ADD is selected.

Accordingly, when the active command and the read command are issued in this order and a row address and a column address are supplied in synchronism with these commands, read data is read from a memory cell MC designated by these row address and column address. Read data DQ is output to outside from the data terminal 24 via an FIFO circuit 15 and an input/output circuit 16. Meanwhile, when the active command and the write command are issued in this order, a row address and a column address are supplied in synchronism with these commands, and then write data DQ is supplied to the data terminal 24, the write data DQ is supplied via the input/output circuit 16 and the FIFO circuit 15 to the memory cell array 11 and written in the memory cell MC designated by these row address and column address. The FIFO circuit 15 and the input/output circuit 16 are operated in synchronism with an internal clock signal LCLK. The internal clock signal LCLK is generated by a DLL circuit 39. Particularly, the input/output circuit 16 includes an output circuit 16a that outputs the read data DQ in synchronism with the internal clock signal LCLK.

The refresh signal IREF is activated when the command signal CMD indicates a refresh command. When the refresh signal IREF is activated, a row access is made by a refresh control circuit 35 and a predetermined word line WL is selected. In this manner, a plurality of memory cells MC connected to the selected word line WL are refreshed. The selection of the word line WL is made by a refresh counter (not shown) included in the refresh control circuit 35.

The mode register set signal MRS is activated when the command signal CMD indicates a mode register set command. Accordingly, when the mode register set command is issued and a mode signal is supplied from the address terminal 21 in synchronism with this command, a set value of the mode register 14 can be rewritten.

A pair of clock terminals 23 is supplied with external clock signals CK and /CK from outside, respectively. These external clock signals CK and /CK are complementary to each other and then transferred to a clock input circuit 36. The clock input circuit 36 generates an internal clock signal ICLK based on the external clock signals CK and /CK. The internal clock signal ICLK is a basic clock signal within the semiconductor device 10. The internal clock signal ICLK is supplied to a timing generator 37 and thus various internal clock signals are generated. The various internal clock signals generated by the timing generator 37 are supplied to circuit blocks such as the address latch circuit 32 and the command decode circuit 34 and define operation timings of these circuit blocks.

The internal clock signal ICLK is also supplied to the DLL circuit 39. The DLL circuit 39 generates the internal clock signal LCLK that is phase-controlled based on the internal clock signal ICLK. As explained above, the internal clock signal LCLK is supplied to the FIFO circuit 15 and the input/output circuit 16. In this manner, the read data DQ is output in synchronism with the internal clock signal LCLK.

The power supply terminals 25 are supplied with the power supply potentials VDD and VSS. The power-supply potentials VDD and VSS supplied to the power supply terminal 25 are supplied to an internal-power-supply generating circuit 38. The internal-power-supply generating circuit 38 generates various internal potentials VPP, VARY, VPERI, and the like based on the power supply potentials VDD and VSS. The internal potential VPP is mainly used in the row decoder 12, the internal potential VARY is mainly used in the memory cell array 11, and the internal potential VPERI is used in many other circuit blocks.

Figure 2:
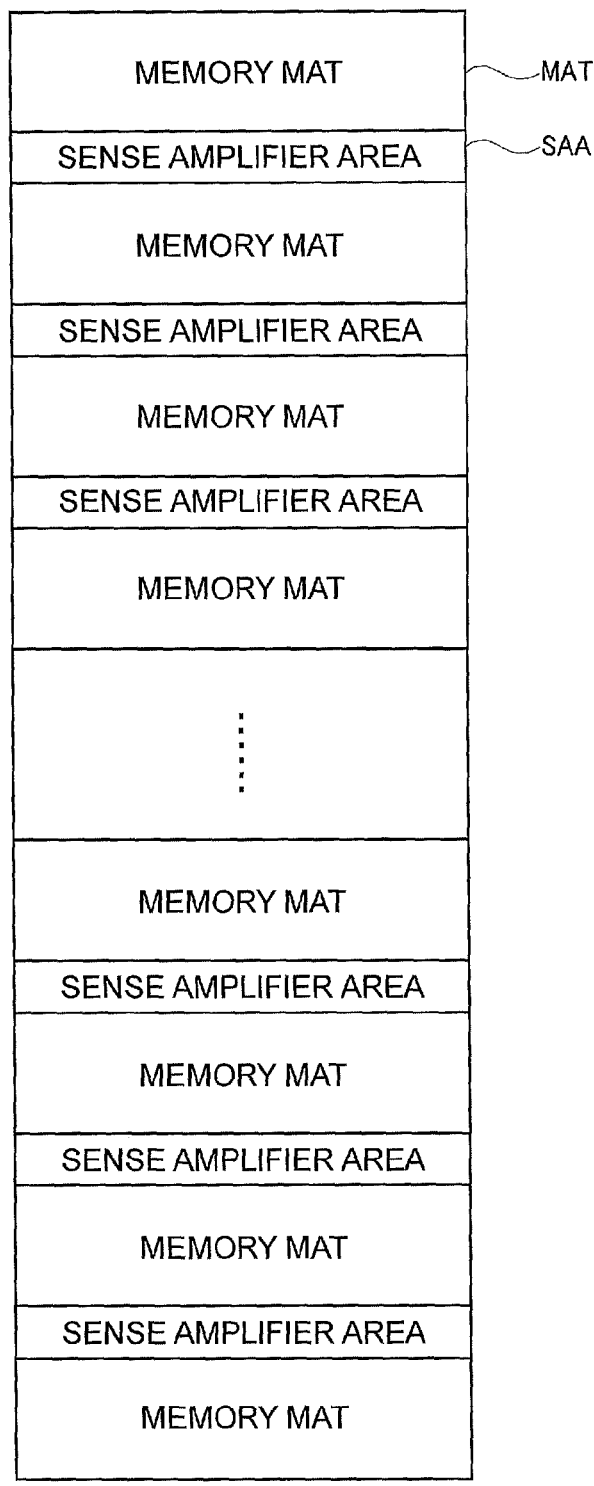
FIG. 2 is a schematic diagram for describing the configuration of the memory cell array shown in FIG. 1.

Turning to FIG. 2, the memory cell array 11 is divided into a plurality of memory mats MAT. A sense amplifier area SAA is arranged between two adjacent memory mats MAT. Each memory mat MAT includes a plurality of word lines WL and a plurality of bit lines BL, at the intersections of which memory cells MC are arranged. The mat selector 12a included in the row decoder 12 selects any one of the plurality of memory mats MAT. The word selector 12b included in the row decoder 12 selects any one of the plurality of word lines WL included in the selected memory mat MAT.

Figure 3:
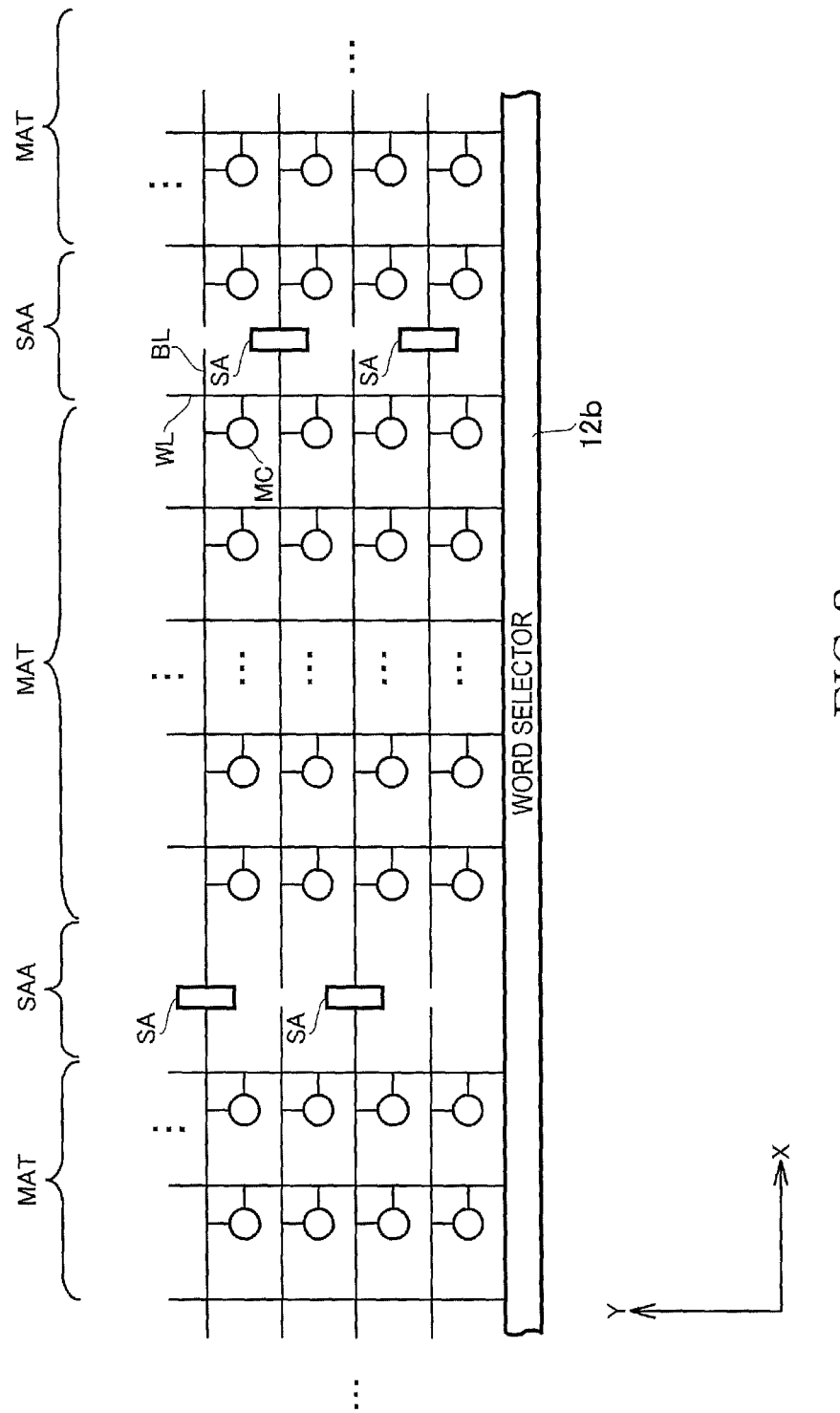
FIG. 3 is an enlarged circuit diagram showing a part of the memory mats shown in FIG. 2.

As shown in FIG. 3, each of the memory mats MAT includes a plurality of word lines WL extending in a Y direction, a plurality of bit lines extending in an X direction, and memory cells MC arranged at the intersections of the word lines WL and the bit lines BL. In the present embodiment, the memory cells MC are DRAM cells, each of the memory cells including a series circuit of a cell transistor and a cell capacitor. The gate electrode of the cell transistor is connected to a corresponding word line WL. The source or drain of the cell transistor is connected to a corresponding bit line BL.

The word lines WL are connected to the word selector 12b which extends in the X direction. Any one of the word lines WL is activated based on a row address. The bit lines BL are connected to sense amplifiers SA which are arranged in the Y direction in the sense amplifier areas SAA. The sense amplifiers SA are also activated based on the row address. Although not shown in the diagram, the sense amplifiers SA are connected to data I/O line through column switches. The column switches are selected based on a column address.

As described above, in the present embodiment, the memory cell array 11 is of open bit line system. The sense amplifiers SA are each connected to a pair of bit lines BL arranged in respective different memory mats MAT, and amplify a potential difference between the pair of bit lines BL.

The lengths of the bit lines BL connected to a sense amplifier SA are determined by the number of word lines allocated to a single memory mat MAT.

An example where the memory cell array 11 is divided into sixteen memory mats MAT0 to MAT15 is explained with reference to FIG. 4.

Suppose, for example, that the total number of word lines WL included in the memory cell array 11 is 2064, including 2048 normal word lines and 16 redundant word lines. In the example shown in FIG. 4, the number of word lines WL allocated to a memory mat MAT is 129. Since the number of word lines WL allocated to a memory mat MAT is relatively small, the bit lines BL connected to each sense amplifier SA have small lengths. This reduces the load of the sense amplifier SA for improved sensing speed. On the other hand, the number of sense amplifier areas SAA increases to cause a problem of increased chip area. Since the number of memory mats MAT can be expressed as a power of 2 ($16=2^4$), the upper four bits of a row address, X7 to X10, can be used to select a memory mat MAT. The mat selector 12a included in the row decoder 12 may thus be a four-bit decoder. The four-bit decoder can be composed of 16 NAND gate circuits with respective different combinations of input signals.

Figure 5:
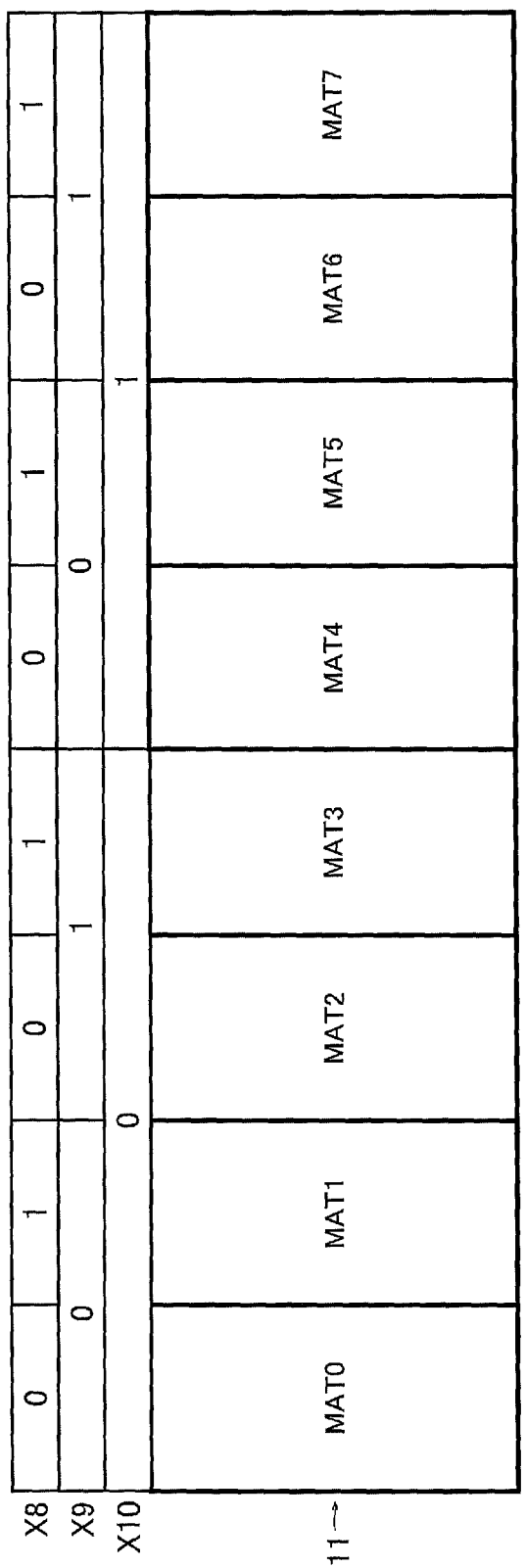
FIG. 5 is a schematic diagram showing an example where the memory cell array is divided into eight memory mats MAT0 to MAT7.

Another example where the memory cell array 11 is divided into eight memory mats MAT0 to MAT7 is explained with reference to FIG. 5.

Again, suppose that the total number of word lines WL included in the memory cell array 11 is 2064. In the example shown in FIG. 5, the number of word lines WL allocated to a memory mat MAT is 258. Since the number of word lines WL allocated to a memory mat MAT is relatively large, the bit lines connected to each sense amplifier SA have large lengths. This increases the load of the sense amplifier SA, with the problem of low sensing speed. On the other hand, the smaller number of sense amplifier areas SAA allows a reduction in chip area. Even in the present example, the number of memory mats MAT can be expressed as a power of 2 ($8=2^3$), and the upper three bits of a row address, X8 to X10, can be used to select a memory mat MAT. The mat selector 12a included in the row decoder 12 may thus be a three-bit decoder. The three-bit decoder can be composed of eight NAND gate circuits with respective different combinations of input signals.

As described above, there is a trade-off between the area occupied by the sense amplifier areas SAA and the operating speed of the sense amplifiers. If the number of memory mats MAT is limited to a number that can be expressed as a power of 2, it is difficult to optimize the area occupied by the sense amplifier areas SAA and the operating speed of the sense amplifiers. To optimize the area occupied by the sense amplifier areas SAA and the operating speed of the sense amplifiers, the number of memory mats MAT sometimes needs to be set to a number that is not able to be expressed as a power of 2.

Still another example where the memory cell array 11 is divided into twelve memory mats MAT0 to MAT11 is explained with reference to FIG. 6.

Again, suppose that the number of word lines WL included in the memory cell array 11 is 2064. In the example shown in FIG. 6, the number of word lines WL allocated to a memory mat MAT is 172. In such a case, the number of word lines WL allocated to a memory mat MAT is almost intermediate between those of the examples shown in FIGS. 4 and 5, and the number of sense amplifier areas SAA is almost intermediate between those of the examples shown in FIGS. 4 and 5. The area occupied by the sense amplifier areas SAA and the operating speed of the sense amplifiers are optimized in such a manner.

In the present example, the number of memory mats MAT is not able to be expressed as a power of 2. The memory mats MAT are therefore not able to be selected by using only the upper bits of a row address. This complicates the configuration of the mat selectors 12a included in the row decoder 12. Specifically, nine bits X2 to X10 of the row address need to be decoded. Decoding these bits at a time needs an extremely large number of elements. The decoding speed decreases as well. In addition, since the boundary addresses of the memory mats MAT are not able to be expressed as a power of 2, the bits X2 to X10 are not able to be divided for predecoding.

A circuit configuration of the mat selector 12a that can solve such a problem will be described in detail below.

Figure 7:
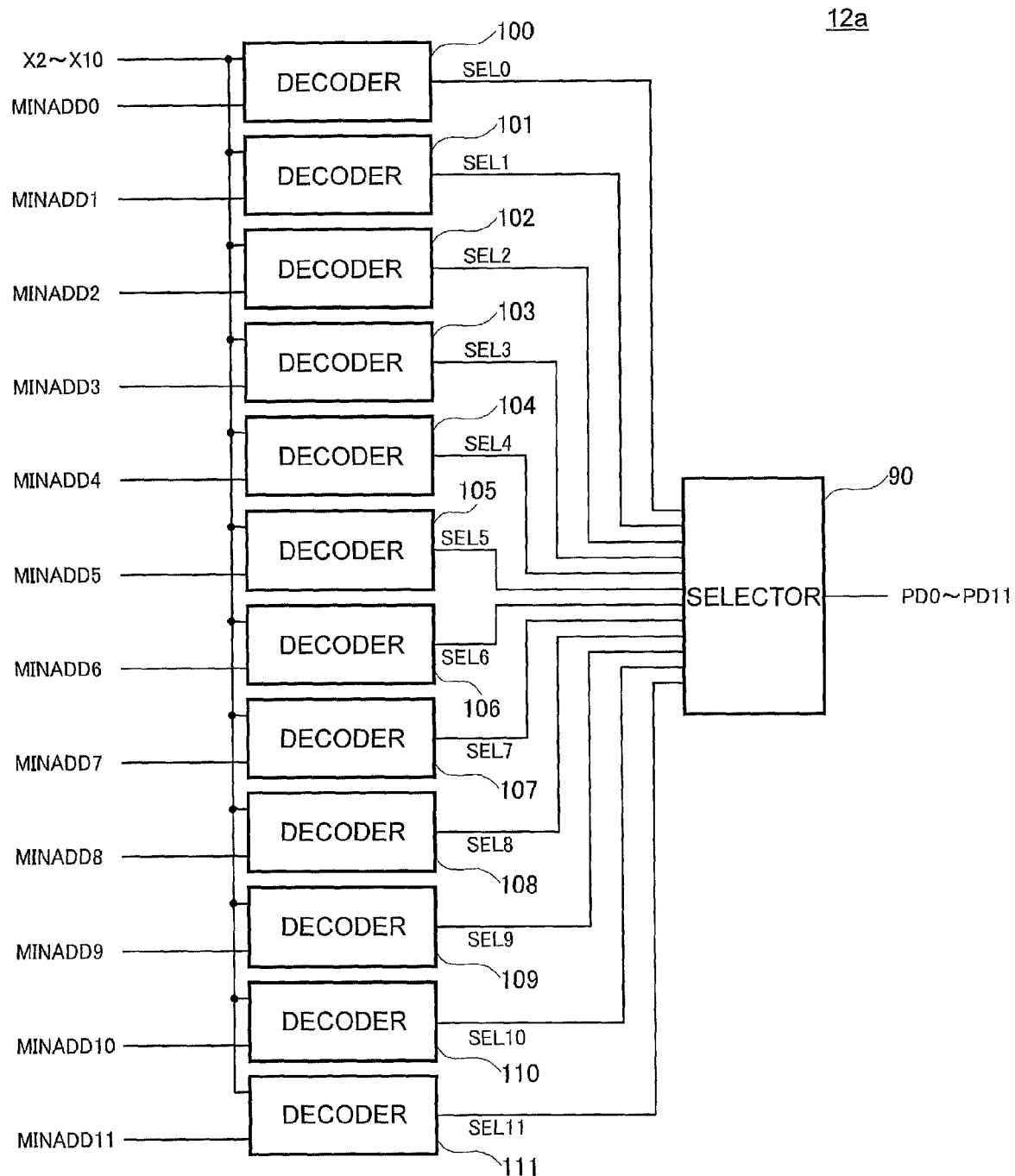
FIG. 7 is a block diagram showing the configuration of the mat selector shown in FIG. 1.

Turning to FIG. 7, the mat selector 12a includes decoders 110 to 111 and a selector 90. The decoders 100 to 111 are allocated to the memory mats MAT0 to MAT11, respectively. The selector 90 receives selection signals SEL0 to SEL11 output from the decoders 100 to 111, respectively, and generates mat selection signals PD0 to PD11 based on the selection signals SEL0 to SEL11. The decoders 110 to 111 are supplied with the nine bits X2 to X10 of the row address in common, and with respective corresponding minimum address values MINADD0 to MINADD11. The minimum address values MINADD0 to MINADD11 indicate minimum addresses assigned to the respective corresponding memory mats MAT0 to MAT11, and each include nine bits Xmin2 to Xmin10. The minimum address values MINADD0 to MINADD11 supplied to the decoders 100 to 111 have respective different values. The minimum address values MINADD0 to MINADD11 constitute information about address ranges allocated to the respective memory mats MAT0 to MAT11.

The minimum address values MINADD0 to MINADD11 are fixed values. Therefore, bits to be set to a low level are connected to wiring that is supplied with a ground potential VSS, and bits to be set to a high level are connected to wiring that is supplied with a power supply potential VDD. Alternatively, fuses or nonvolatile storage elements corresponding to the minimum address values MINADD0 to MINADD11 may be provided. Such fuses or nonvolatile storage elements can be programmed with predetermined values to obtain the minimum address values MINADD0 to MINADD11.

Figure 8:
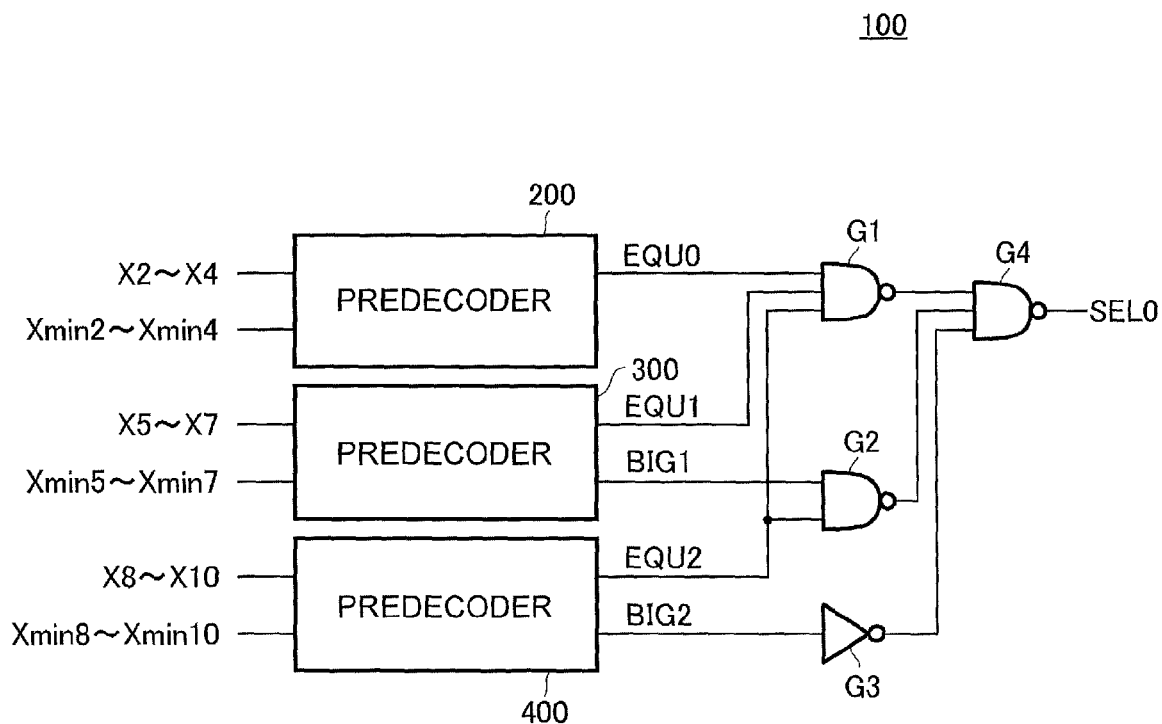
FIG. 8 is a block diagram showing the configuration of the decoder shown in FIG. 7.

The configuration of the decoder 100 is shown in FIG. 8. The other decoders 101 to 111 shown in FIG. 7 have the same configuration as that of the decoder 100 except that the respective corresponding minimum address values MINADD1 to MINADD11 are supplied thereto. Thus, redundant description will be omitted.

As shown in FIG. 8, the decoder 100 includes three predecoders 200, 300, and 400, and logic gate circuits G1 to G4 which generate a selection signal SEL0 based on the output signals of the three predecoders 200, 300, and 400. The predecoder 200 receives the three bits X2 to X4 of the row address and the three bits Xmin2 to Xmin4 of the minimum address value MINADD0, and generates a signal EQU0 based on the bits. The predecoder 300 receives the three bits X5 to X7 of the row address and the three bits Xmin5 to Xmin7 of the minimum address value MINADD0, and generates signals EQU1 and BIG1 based on the bits. The predecoder 400 receives the three bits X8 to X10 of the row address and the three bits Xmin8 to Xmin10 of the minimum address value MINADD0, and generates signals EQU2 and BIG2 based on the bits.

The signal EQU0 output from the predecoder 200 becomes a high level if the bits X2 to X4 of the row address have a value equal to or greater than that of the bits Xmin2 to Xmin4 of the minimum address value MINADD0. The signal EQU1 output from the predecoder 300 becomes a high level if the bits X5 to X7 of the row address have a value equal to that of the bits Xmin5 to Xmin7 of the minimum address value MINADD0. The signal BIG1 becomes a high level if the value of the bits X5 to X7 of the row address is greater than that of the bits Xmin5 to Xmin7 of the minimum address value MINADD0. Similarly, the signal EQU2 output from the predecoder 400 becomes a high level if the bits X8 to X10 of the row address have a value equal to that of the bits Xmin8 to Xmin10 of the minimum address value MINADD0. The signal BIG2 becomes a high level if the value of the bits X8 to X10 of the row address is greater than that of the bits Xmin8 to Xmin10 of the minimum address value MINADD0.

Figure 9:
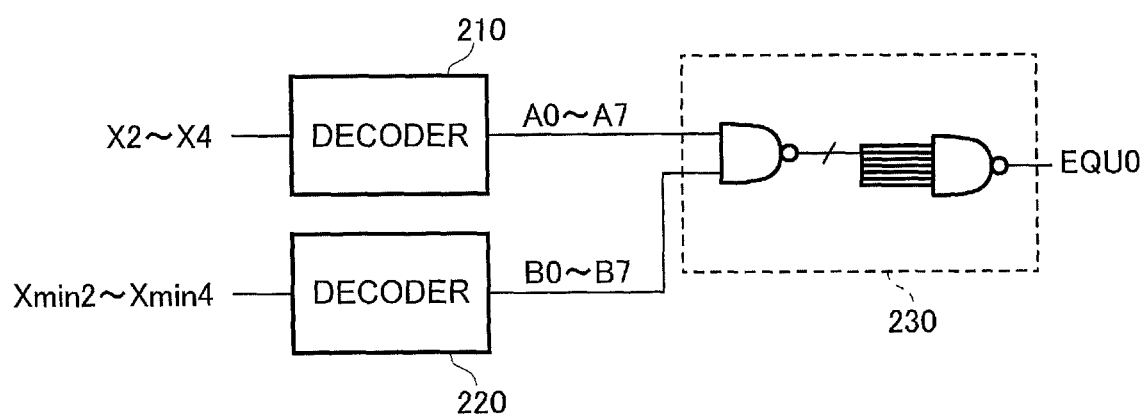
FIG. 9 is a circuit diagram of the predecoder 200 shown in FIG. 8.

As shown in FIG. 9, the predecoder 200 includes a decoder 210 which decodes the bits X2 to X4 of the row address, a decoder 220 which decodes the bits Xmin2 to Xmin4 of the minimum address value MINADD0, and a logic circuit 230 which logically ORs the output signals of the decoders 210 and 220. The decoder 210 is an ordinary decoder that activates any one bit of its output signals A0 to A7 based on the bits X2 to X4 of the row address. A truth table of the decoder 210 is shown in FIG. 10. The decoder 220 is a decoder that activates one to eight bits of its output signals B0 to B7 based on the bits Xmin2 to Xmin4 of the minimum address value MINADD0. A truth table of the decoder 220 is shown in FIG. 11.

The output signals A0 to A7 and B0 to B7 thus generated are logically ORed by the logic circuit 230. The logic circuit 230 includes eight NAND gate circuits that each receive an associated one of the output signals A0 to A7 and an associated one of the output signals B0 to B7, and an eight-input NAND gate circuit that receives the output signals of the eight NAND gate circuits. Consequently, as described above, the signal EQU0 output from the predecoder 200 becomes a high level if the bits X2 to X4 of the row address have a value equal to or greater than that of the bit Xmin2 to Xmin4 of the minimum address MINADD0. In the other case, the signal EQU0 becomes a low level.

Figure 12:
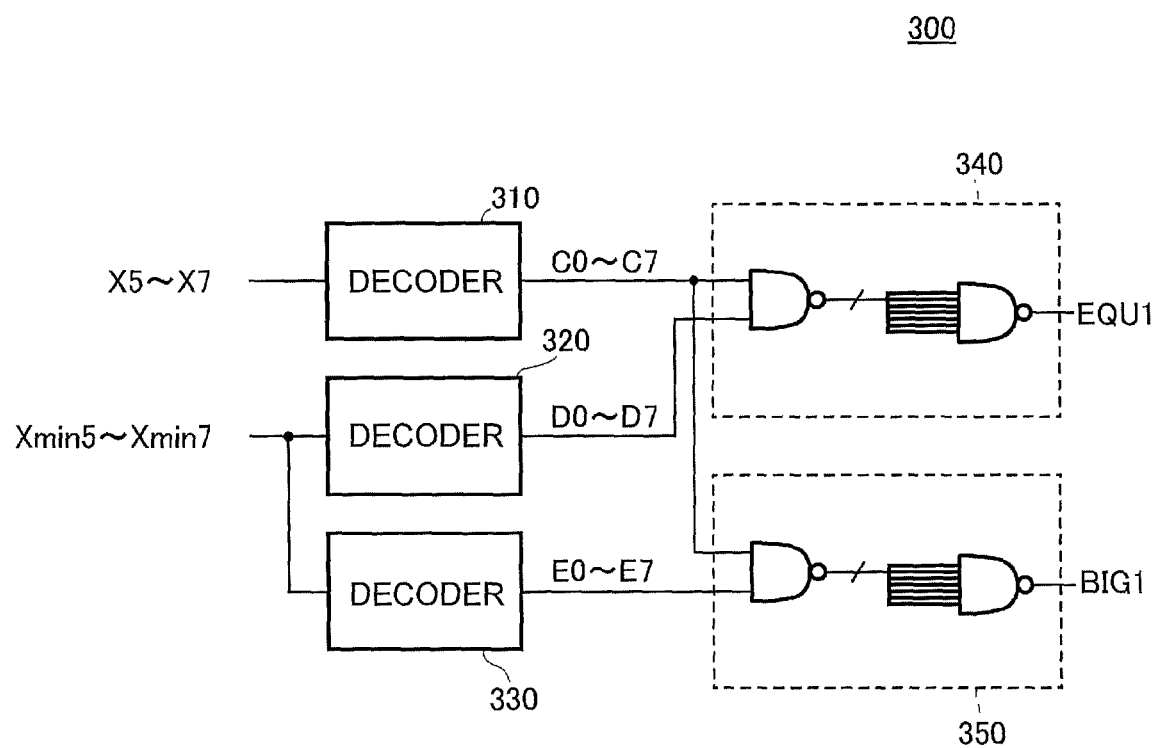
FIG. 12 is a circuit diagram of the predecoder 300 shown in FIG. 8.

Turning to FIG. 12, the predecoder 300 includes a decoder 310 which decodes the bits X5 to X7 of the row address, decoders 320 and 330 which decode the bits Xmin5 to Xmin7 of the minimum address value MINADD0, a logic circuit 340 which logically ORs the output signals of the decoders 310 and 320, and a logic circuit 350 which logically ORs the output signals of the decoders 310 and 330. The decoder 310 is an ordinary decoder that activates any one bit of its output signals C0 to C7 based on the bits X5 to X7 of the row address. In other words, the decoder 310 has the same function as that of the decode 210. The truth table of the decoder 310 is the same as shown in FIG. 10.

The decoder 320 is an ordinary decoder that activates one bit of its output signals D0 to D7 based on the bits Xmin5 to Xmin7 of the minimum address value MINADD0. In other words, the decoder 320 has the same function as that of the decoder 210, with the same truth table as shown in FIG. 10. The decoder 330 is a decoder that actives zero to seven bits of its output signals E0 to E7 based on the bits Xmin5 to Xmin7 of the minimum address value MINADD0. A truth table of the decoder 330 is shown in FIG. 13.

The output signals C0 to C7 and C0 to D7 thus generated are logically ORed by the logic circuit 340. The logic circuit 340 has the same circuit configuration as that of the logic circuit 230 shown in FIG. 9. Consequently, as described above, the signal EQU1 output from the predecoder 300 becomes a high level if the bits X5 to X7 of the row address have a value equal to that of the bits Xmin5 to Xmin7 of the minimum address value MINADD0. In other cases, the signal EQU1 becomes a low level. The output signals C0 to C7 and E0 to E7 are ORed by the logic circuit 350. The logical circuit 350 also has the same circuit configuration as that of the logic circuit 230 shown in FIG. 9. Consequently, as described above, the signal BIG1 output from the decoder 300 becomes a high level if the bits X5 to X7 of the row address have a value greater than that of the bits Xmin5 to Xmin7 of the minimum address value MINADD0. In other cases, the signal BIG1 becomes a low level.

The predecoder 400 has the same circuit configuration as that of the predecoder 300 except that the bits X8 to X10 of the row address and the bits Xmin8 to Xmin10 of the minimum address value MINADD0 are used instead of the bits X5 to X7 of the row address and the bits Xmin5 to Xmin7 of the minimum address value MINADD0. Consequently, the signal EQU2 output from the predecoder 400 becomes a high level if the bits X8 to X10 of the row address have a value equal to that of bits Xmin8 to Xmin10 of the minimum address value MINADD0. In other cases, the signal EQU2 becomes a low level. The signal BIG2 output from the pre-decoder 400 becomes a high level if the bits X8 to X10 of the row address have a value greater than that of the bits Xmin8 to Xmin10 of the minimum address value MINADD0. In other cases, the signal BIG2 becomes a low level.

The signals EQU0 to EQU2, BIG1, and BIG2 thus generated are supplied to the logic gate circuits G1 to G4 shown in FIG. 8. As a result, the selection signal SEL0 becomes a high level if the bits X2 to X10 of the row address have a value equal to or greater than that of the bits Xmin2 to Xmin10 of the minimum address value MINADD0.

As mentioned above, the other decoders 101 to 111 have the same configuration as that of the decoder 100 shown in FIG. 8 except that the respective corresponding minimum address values MINADD1 to MINADD11 are supplied thereto. If the access-requested address is equal to or higher than the minimum address values MINADD0 to MINADD11 assigned to the respective memory mats MAT0 to MAT11, the corresponding selection signals SEL0 to SEL11 become a high level.

Figure 14:
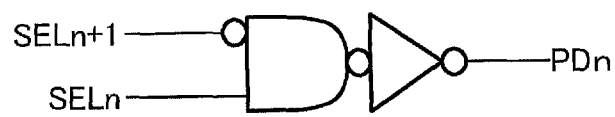
FIG. 14 is a circuit diagram of the selector shown in FIG. 7.

Turning to FIG. 14, the selector 90 includes a plurality of logic gate circuits that each receives selection signals SELn and SELn+1. Here, n=0 to 10. As for the logic gate circuit that receives the selection signal SEL11, the signal corresponding to the selection signal SELn+1 is fixed to a low level. With such a configuration, if and only if the selection signal SELn is at a high level and the selection signal SELn+1 is at a low level, the corresponding one of the mat selection signals PD0 to PD11 is activated to a high level. As a result, only one bit of the mat selection signals PD0 to PD11 is activated to a high level.

The configuration of the mat selector 12a has been described above. According to such a configuration, when an access is requested, any one bit of the mat selection signals PD0 to PD11 is activated according to the value of the bits X2 to X10 of the address signal, whereby the corresponding one of the memory mats MAT0 to MAT11 is selected. In this specification, the bits of the address signal supplied to the mat selector 12a may be referred to as "first bits." In this specification, the bits X2 to X10 are first bits.

The word selector 12b then selects any one of the 172 word lines WL included in the selected memory mat MAT based on the lower bits X0 to X7 of the address signal. In this specification, the bits of the address signal supplied to the word selector 12b may be referred to as "second bits." In this specification, the bits X0 to X7 are second bits. As can be seen, according to the present embodiment, the first bits and the second bits overlap with each other.

The operation of the mat selector 12a will be explained with reference to FIG. 15.

Figure 15:
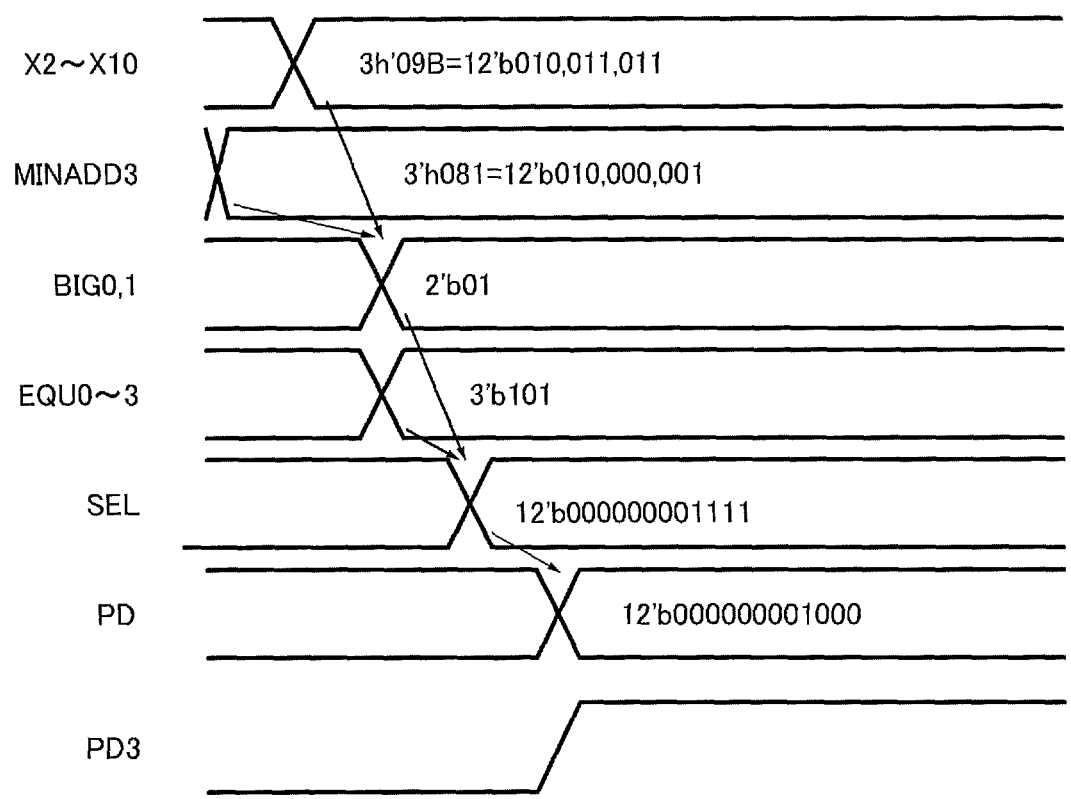
FIG. 15 is a timing chart showing an example of the operation of the mat selector.

The example of FIG. 15 shows a case where the bits X2 to X10 of the access-requested address signal have a value of "09B" in hexadecimal notation, or "010011011" in binary. The minimum address value MINADD3 assigned to the memory mat MAT3 is "081" in hexadecimal notation, or "010000001" in binary. FIG. 15 shows the outputs EQU0 to EQU2, BIG1, and BIG2 of the predecoders 200, 300, and 400 when such an address is input. As a result, the selection signals SEL0 to SEL3 become a high level and the selection signals SEL4 to SEL11 a low level, whereby the mat selection signal PD3 is activated to a high level. The memory mat MAT3 is thus selected.

As described above, in the present embodiment, the minimum address values MINADD0 to MINADD11 assigned to the respective memory mats MAT0 to MAT11 and the supplied address signal are compared to select anyone of the memory mats MAT0 to MAT11. Consequently, even if the number of memory mats MAT0 to MAT11 is not able to be expressed as a power of 2, the select operation can be performed with a relatively simple circuit configuration. This allows a reduction in the number of elements for reduced chip area and increased decoding speed.

Since the minimum address values MINADD0 to MINADD11 assigned to the memory mats MAT0 to MAT11 are used, the circuit for generating the minimum address values MINADD0 to MINADD11 has only to be redesigned when the minimum address values MINADD0 to MINADD11 are changed for a design change. In contrast, if an ordinary decoding method is used, the entire decoding circuit including a large number of logic gates needs to be redesigned, which needs a long period for a design change. The present embodiment is free from such a problem.

Figure 16:
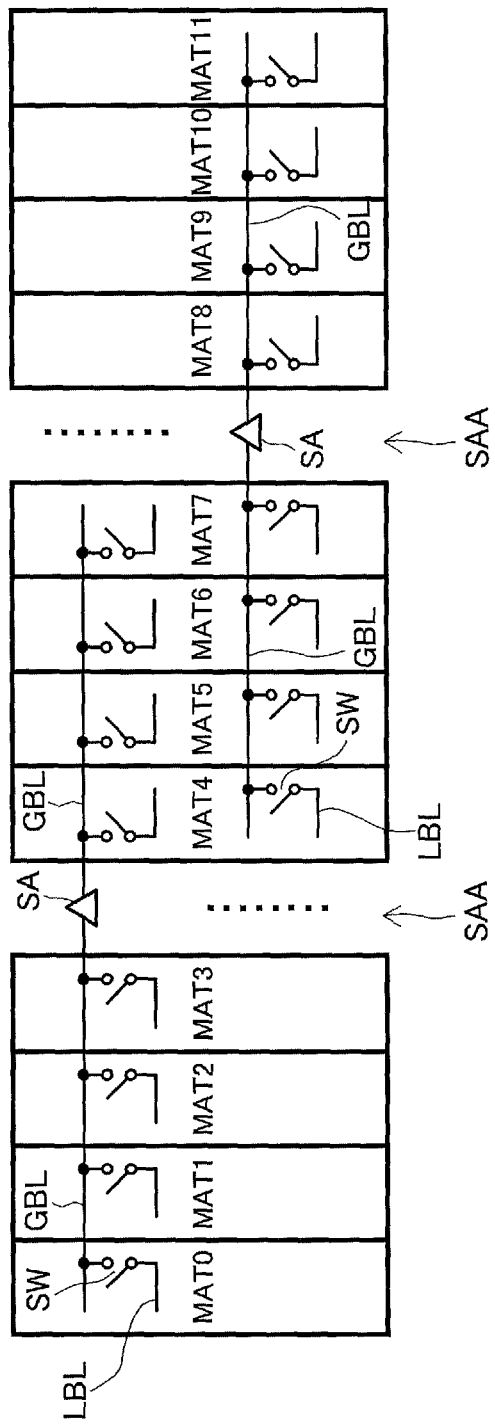
FIG. 16 is a schematic diagram showing the configuration of the memory cell array according to a modification of the embodiment.

In the example shown in FIG. 16, sense amplifier areas SAA are arranged between the memory mats MAT5 and MAT4 and between the memory mats MAT7 and MAT8. The bit lines have a hierarchical structure. Local bit lines LBL allocated to the individual memory mats MAT0 to MAT11 are connected to global bit lines GBL through switches SW. A pair of global bit lines GBL are connected to a sense amplifier SA. The memory cell array 11 having such a configuration also involves selecting the memory mats MAT0 to MAT11. The foregoing mat selector 12a can be used to reduce the chip area and increase the decoding speed.

According to the embodiment of the present invention, the circuit blocks are selected by referring to the information about the address ranges. This can reduce the number of elements needed for the first selection circuit for selecting the circuit blocks, and increase the decoding speed as well.

It is apparent that the present invention is not limited to the above embodiments, but may be modified and changed without departing from the scope and spirit of the invention.

For example, the foregoing embodiment has dealt with the case where any one of the memory mats MAT0 to MAT11 is selected by referring to the minimum address values assigned to the respective memory mats MAT0 to MAT11. The present invention is not limited thereto. Any one of the memory mats MAT0 to MAT11 may be selected by referring to maximum address values assigned to the respective memory mats MAT0 to MAT11. Any one of the memory mats MAT0 to MAT11 may be selected by referring to both the minimum and maximum address values assigned to the memory mats MAT0 to MAT11.

The foregoing embodiment has dealt with the case where the present invention is applied to the selection of the word lines WL. However, the scope of application of the present invention is not limited thereto. The present invention may be applied to circuits for selecting other selection lines such as column selection lines.

What is claimed is:

1. A device comprising:
a plurality of circuit blocks each including a plurality of selection lines to which respective different addresses are assigned so that respective different address ranges are assigned to the circuit blocks;
a first selection circuit selecting one of the circuit blocks by comparing an address signal with information related to the address ranges of the circuit blocks; and
a second selection circuit selecting at least one of the selection lines included in selected one of the circuit blocks based on the address signal,
wherein the address signal comprising a plurality of address bits,
the first selection circuit selects one of the circuit blocks based on a first portion of the address bits,
the second selection circuit selects at least one of the selection lines based on a second portion of the address bits, and
the first and second portions of the address bits overlap with each other at least in part.

2. The device as claimed in claim 1, wherein the information includes at least one of an address of a selection line to which a maximum address value is assigned and an address of a selection line to which a minimum address value is assigned among the selection lines included in each of the circuit blocks.

3. The device as claimed in claim 2, wherein the information includes one of the address of the selection line to which the maximum address value is assigned and the address of the selection line to which the minimum address value is assigned among the selection lines included in each of the plurality of circuit blocks, and does not include the other.

4. The device as claimed in claim 1, wherein the information is nonvolatile information that is obtained in a fixed manner.

5. The device as claimed in claim 1, wherein
the address signal is a row address,
the circuit blocks are memory mats each including a plurality of memory cells, and
the selection lines are word lines that select at least one of the memory cells.

* * * * *